(12) United States Patent
Yao et al.

(10) Patent No.: US 11,923,293 B2
(45) Date of Patent: Mar. 5, 2024

(54) BARRIER STRUCTURE ON INTERCONNECT WIRE TO INCREASE PROCESSING WINDOW FOR OVERLYING VIA

(71) Applicant: Taiwan Semiconductor Manufacturing Company, Ltd., Hsinchu (TW)

(72) Inventors: Hsin-Chieh Yao, Hsinchu (TW); Chung-Ju Lee, Hsinchu (TW); Chih Wei Lu, Hsinchu (TW); Hsi-Wen Tien, Xinfeng Township (TW); Wei-Hao Liao, Taichung (TW); Yu-Teng Dai, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 224 days.

(21) Appl. No.: 17/370,107

(22) Filed: Jul. 8, 2021

(65) Prior Publication Data
US 2023/0011391 A1 Jan. 12, 2023

(51) Int. Cl.
*H01L 23/522* (2006.01)
*H01L 21/768* (2006.01)

(52) U.S. Cl.
CPC .... *H01L 23/5226* (2013.01); *H01L 21/76831* (2013.01); *H01L 21/76832* (2013.01)

(58) Field of Classification Search
CPC .......... H01L 23/5226; H01L 23/53295; H01L 23/5329; H01L 23/53238; H01L 21/76834; H01L 21/76831; H01L 21/76832; H01L 21/76877; H01L 21/76807; H01L 21/76802; H01L 21/76843; H01L 21/76849; H01L 21/76897
See application file for complete search history.

(56) References Cited

U.S. PATENT DOCUMENTS

| | | | | |
|---|---|---|---|---|
| 9,349,691 | B2* | 5/2016 | Murray | H01L 23/53295 |
| 2018/0033727 | A1* | 2/2018 | Lee | H01L 21/76844 |
| 2022/0157710 | A1* | 5/2022 | Li | H01L 21/76831 |
| 2022/0157711 | A1* | 5/2022 | Lee | H01L 21/76834 |
| 2022/0344264 | A1* | 10/2022 | Yao | H01L 21/76832 |
| 2022/0392801 | A1* | 12/2022 | Liao | H01L 21/76897 |

OTHER PUBLICATIONS

U.S. Appl. No. 17/236,234, filed Apr. 21, 2021.

* cited by examiner

*Primary Examiner* — Jaehwan Oh
*Assistant Examiner* — John M Parker
(74) *Attorney, Agent, or Firm* — Eschweiler & Potashnik, LLC

(57) ABSTRACT

In some embodiments, the present disclosure relates to an integrated chip that includes a first interconnect dielectric layer arranged over a substrate. An interconnect wire extends through the first interconnect dielectric layer, and a barrier structure is arranged directly over the interconnect wire. The integrated chip further includes an etch stop layer arranged over the barrier structure and surrounds outer sidewalls of the barrier structure. A second interconnect dielectric layer is arranged over the etch stop layer, and an interconnect via extends through the second interconnect dielectric layer, the etch stop layer, and the barrier structure to contact the interconnect wire.

20 Claims, 10 Drawing Sheets

US 11,923,293 B2

BARRIER STRUCTURE ON INTERCONNECT WIRE TO INCREASE PROCESSING WINDOW FOR OVERLYING VIA

BACKGROUND

As dimensions and feature sizes of semiconductor integrated circuits (ICs) are scaled down, the density of the elements forming the ICs is increased and the spacing between elements is reduced. Such spacing reductions are limited by light diffraction of photolithography, mask alignment, isolation and device performance among other factors. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
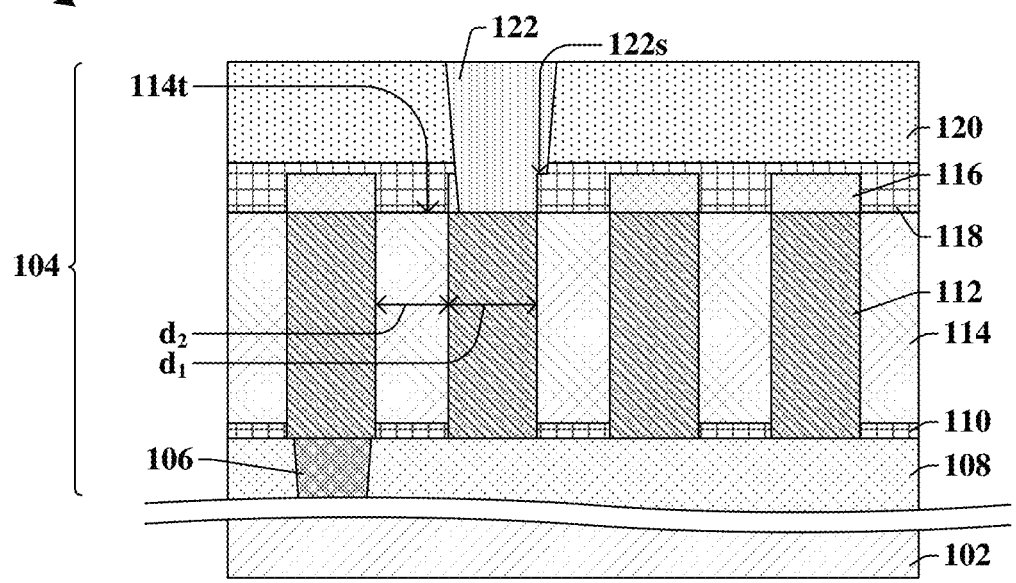
FIG. 1A illustrates a cross-sectional view of some embodiments of an integrated chip having a barrier structure arranged over a first interconnect wire, wherein an interconnect via extends through the barrier structure and an etch stop layer to contact the first interconnect wire.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, inductors, capacitors, etc.) and/or memory devices disposed over and/or within a semiconductor substrate. An interconnect structure may be disposed over the semiconductor substrate and coupled to the semiconductor devices. The interconnect structure may include conductive interconnect layers having interconnect wires and interconnect vias within an interconnect dielectric structure. The interconnect wires and/or interconnect vias provide electrical pathways between different semiconductor devices disposed within and/or over the semiconductor substrate.

Some embodiments of an interconnect structure include first interconnect wires coupled to an underlying semiconductor device, and an interconnect via is arranged over and coupled to one of the first interconnect wires. During manufacturing, the first interconnect wires embedded within a first interconnect dielectric layer may be formed. Then, a second interconnect dielectric layer may be deposited over the first interconnect dielectric layer and the first interconnect wires. A cavity may be formed within the second interconnect dielectric layer using photolithography and removal processes to expose a top surface of one of the first interconnect wires. Then, a conductive material may be formed within the cavity to form an interconnect via coupled to the one of the first interconnect wires.

However, as the size of the integrated chips decrease, the first interconnect wires and spacing between the first interconnect wires decrease, and forming the cavity that is centered directly over the one of the first interconnect wires becomes more difficult due to processing limitations. Some examples of such processing limitations include precision/accuracy of overlaying a masking structure for photolithography that is directly centered on the one of the first interconnect wires and/or achieving a small enough opening in the masking structure corresponding to the one of the interconnect wires that is used for the formation of the cavity. In some cases, if the cavity is not centered over the one of the first interconnect wires, the cavity may be partially formed over the first interconnect dielectric layer. In such embodiments, the removal process used to form the cavity may also remove a portion of the first interconnect dielectric layer. In such embodiments, a portion of the interconnect via in the final structure may be arranged directly between adjacent ones of the first interconnect wires, which may increase capacitance and/or reduce the time of the first interconnect dielectric layer to breakdown between the adjacent ones of the first interconnect wires, thereby reducing the reliability of the overall integrated chip.

Various embodiments of the present disclosure relate to barrier structures selectively formed on top surfaces of the first interconnect wires in an interconnect structure. An etch stop layer is then formed over and between the barrier structures. A second interconnect dielectric layer is formed over the etch stop layer. The barrier structures may comprise a dielectric material or a metal, and the barrier structures comprise a different material than the first interconnect wires, the etch stop layer, and the second interconnect dielectric layer, in some embodiments. Then, photolithography and removal processes may be performed to form a cavity that extends through the second interconnect dielectric layer, the etch stop layer, and one of the barrier structures to expose an upper surface of one of the first interconnect wires. A second removal process comprising a second etchant may be used to remove portions of the etch stop layer, wherein the barrier structures are substantially resistant to removal by the second etchant. Similarly, in some embodiments, a third removal process comprising a third etchant may be used to remove the barrier structures, wherein the etch stop layer is substantially resistant to removal by the third etchant.

Thus, in some embodiments, even if the cavity is formed directly over a portion of the first interconnect dielectric layer due to processing limitations, the etching selectivity between the barrier structures and the etch stop layer prevents the cavity from extending into and/or exposing the first interconnect dielectric layer. Therefore, the resulting interconnect via formed within the cavity is not arranged directly between adjacent ones of the first interconnect wires. Thus, the processing window for forming the interconnect via is increased while isolation between the adjacent ones of the first interconnect wires is maintained, thereby reducing cross-talk and increasing reliability of the overall integrated chip.

FIG. 1A illustrates a cross-sectional view 100A of some embodiments of an integrated chip comprising an interconnect via extending through a barrier structure to contact a first interconnect wire.

The integrated chip of FIG. 1A includes an interconnect structure 104 arranged over a substrate 102. In some embodiments, the interconnect structure 104 comprise a lower interconnect via 106, first interconnect wires 112 arranged over and coupled to the lower interconnect via 106, and an interconnect via 122 arranged over and coupled to one of the first interconnect wires 112. In some embodiments, the interconnect structure 104 may further comprise a lower interconnect dielectric layer 108 surrounding the lower interconnect via 106, a first interconnect dielectric layer 114 surrounding the first interconnect wires 112, and a second interconnect dielectric layer 120 surrounding the interconnect via 122. In some embodiments, a first etch stop layer 110 may be arranged over the lower interconnect dielectric layer 108 and between the lower interconnect dielectric layer 108 and the first interconnect dielectric layer 114. In some embodiments, a second etch stop layer 118 may be arranged over the first interconnect dielectric layer 114 and arranged between the first interconnect dielectric layer 114 and the second interconnect dielectric layer 120.

Further, in some embodiments, the interconnect structure 104 may be coupled to one or more semiconductor devices (e.g., transistors, inductors, capacitors, etc.) and/or memory devices (not shown) disposed over and/or within the substrate 102. Thus, the conductive features (e.g., lower interconnect via 106, first interconnect wires 112, interconnect via 122) of the interconnect structure 104 may be electrically coupled to one another and to any underlying or overlying devices (not shown) to provide a conductive pathway for signals (e.g., voltage, current) traveling through the integrated chip.

In some embodiments, the first interconnect wires 112 each have a width equal to a first distance $d_1$ in a range of between, for example, approximately 5 nanometers and approximately 1000 nanometers. Further, in some embodiments, one of the first interconnect wires 112 may be spaced apart from an adjacent one of the first interconnect wires 112 by a second distance $d_2$. In some embodiments, the second distance $d_2$ may be in a range of between, for example, approximately 5 nanometers and approximately 1000 nanometers. In some embodiments, the first interconnect wires 112 are spaced apart from one another by the first interconnect dielectric layer 114. In some embodiments, the first interconnect dielectric layer 114 comprises a low-k dielectric material such as, for example, silicon carbide, silicon dioxide, silicon oxygen carbide, silicon nitride, silicon carbon nitride, silicon oxynitride, silicon oxygen carbon nitride, or some other suitable dielectric material. The low-k dielectric material of the first interconnect dielectric layer 114 and/or any other isolation structures (e.g., other dielectric layers, air spacer structures, etc.) arranged laterally between the first interconnect wires 112 reduce capacitance and prevent cross-talk between adjacent ones of the first interconnect wires 112.

In some embodiments, a barrier structure 116 is arranged over each first interconnect wires 112. In some embodiments, the barrier structure 116 may also have a width equal to the first distance $d_1$, and the barrier structure 116 may have a bottommost surface that completely and directly overlies a top surface of the first interconnect wire 112. Thus, in some embodiments, a width of the bottommost surface of the barrier structure 116 may be less than or equal to a width of the top surface of the first interconnect wire 112. In some embodiments, the second etch stop layer 118 laterally surrounds outer sidewalls of the barrier structure 116 and is also arranged directly over the barrier structure 116. Thus, the barrier structures 116 are spaced apart from one another by the second etch stop layer 118, and the barrier structures 116 are spaced apart from the second interconnect dielectric layer 120 by the second etch stop layer 118.

In some embodiments, the barrier structure 116 comprises, for example, hafnium oxide, lithium niobium oxide, lithium nitrogen oxide, magnesium oxide, manganese oxide, molybdenum oxide, niobium oxide, nitrogen oxide, silicon oxide, silicon oxygen carbide, silicon oxygen carbon nitride, silicon oxynitride, silicon carbide, tin oxide, tin silicon oxide, strontium oxide, tantalum oxide, tantalum oxynitride, titanium oxide, titanium oxynitride, tungsten oxide, zinc oxide, zirconium oxide, or some other suitable dielectric material and/or metal-oxide. In some other embodiments, the barrier structure 116 may comprise a metal such as, for example, tantalum, tantalum nitride, titanium nitride, copper, cobalt, ruthenium, molybdenum, iridium, tungsten, or some other suitable metallic material. Nevertheless, in some embodiments, the barrier structure 116 comprises a different material than the second etch stop layer 118 and a different material than the first interconnect wires 112. Further, the barrier structure 116 comprises a material that allows the barrier structure 116 to be selectively formed on the first interconnect wire 112 but not on the first interconnect dielectric layer 114 to increase the efficiency of the formation of the barrier structure 116.

In some embodiments, the interconnect via 122 extends through the second interconnect dielectric layer 120, the second etch stop layer 118, and the barrier structure 116 to directly contact the first interconnect wire 112. In some embodiments, because the first distance $d_1$ of the first interconnect wires 112 and the second distance $d_2$ between the first interconnect wires 112 are so small (e.g., between about 5 nanometers and about 1000 nanometers), forming the interconnect via 122 to land directly on the first interconnect wire 112 is more difficult due to processing limitations. To prevent the interconnect via 122 from being formed below a topmost surface 114t of the first interconnect dielectric layer 114 which would increase capacitance between the first interconnect wires 112, the second etch stop layer 118 and the barrier structure 116 are utilized.

In some embodiments, to form the interconnect via 122, a masking structure comprising an opening is formed over the second interconnect dielectric layer 120. A first removal process may be performed to remove portions of the second interconnect dielectric layer 120 arranged directly below the opening of the masking structure. In such embodiments, the second etch stop layer 118 may comprise a different material than the second interconnect dielectric layer 120 and be substantially resistant to removal by the first removal process. Then, in some embodiments, a second removal process may be performed to remove portions of the second etch stop layer 118 arranged directly below the opening of the masking structure. After the second removal process, the barrier structure 116 may be exposed. However, the second removal process may be controlled by, for example, etching time based on a thickness of the second etch stop layer 118, such that after the second removal process, the first interconnect dielectric layer 114 is still completely covered by the second etch stop layer 118. As a result, in some embodiments, the interconnect via 122 may comprise a horizontal surface 122s arranged directly over the first interconnect dielectric layer 114, wherein the horizontal surface 122s is between topmost and bottommost surfaces of the interconnect via 122. In some embodiments, a third removal process may be performed to remove portions of the barrier structure 116 according to the masking structure to expose the first interconnect wire 112. The second etch stop layer 118 is substantially resistant to removal by the third removal process to protect the first interconnect dielectric layer 114. After the first, second, and third removal processes, the interconnect via 122 may be formed and directly contacts the first interconnect wire 112 without being arranged directly between adjacent ones of the first interconnect wires 112.

Thus, in some embodiments, even if a portion of the opening of the masking structure used to form the interconnect via 122 is arranged directly over the first interconnect dielectric layer 114, the first interconnect dielectric layer 114 is not removed during the formation of the interconnect via 122. As a result, the interconnect via 122 does not extend below an upper surface of the first interconnect wires 112 and isolation between adjacent ones of the first interconnect wires 112 provided by the first interconnect dielectric layer 114 may be maintained, thereby reducing cross-talk between the first interconnect wires 112 and maintaining and/or increasing reliability of the interconnect structure 104.

Figure 1B:
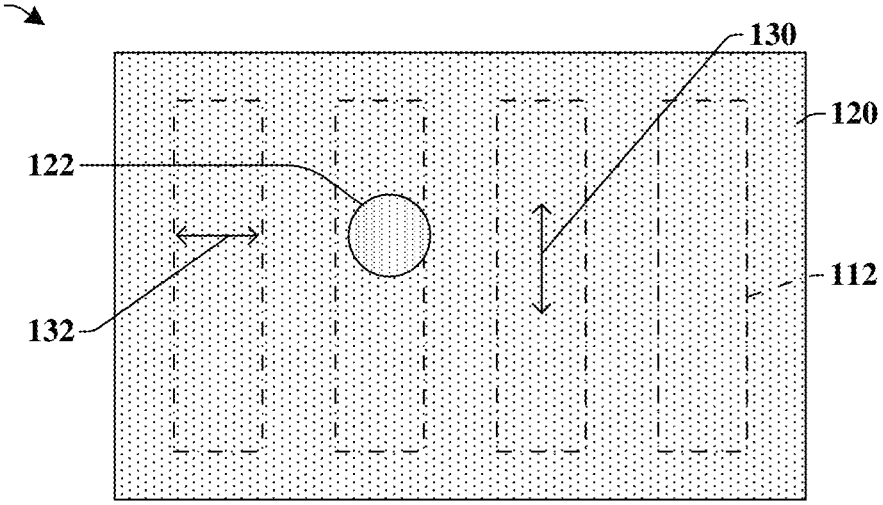
FIG. 1B illustrates a top-view of some embodiments corresponding to FIG. 1A.

FIG. 1B illustrates a top-view 100B of some embodiments corresponding to the cross-sectional view 100A of FIG. 1A.

In some embodiments, from the top-view 100B, the first interconnect wires 112 are arranged beneath the second interconnect dielectric layer 120, and thus, the first interconnect wires 112 are illustrated using a dot-hash line. In some embodiments, the first interconnect wires 112 extend in a first direction 130. In some embodiments, the barrier structure (116 of FIG. 1A) and the second etch stop layer (118 of FIG. 1A) aid in increasing the processing window of the interconnect via 122 at least in a second direction 132 perpendicular to the first direction 130.

In some embodiments, it will be appreciated that from the top-view 100B, although it may appear that the interconnect via 122 is arranged between adjacent ones of the first interconnect wires 112, the interconnect via 122 is not arranged directly between adjacent ones of the first interconnect wires 112 in the second direction 132 as illustrated in the cross-sectional view 100A of FIG. 1A. In some embodiments, from the top-view 100B, the interconnect via 122 may have a circular profile. In other embodiments, from the top-view 100B, the interconnect via 122 may exhibit a rectangular, oval-like, or some other shape profile. Further, in some embodiments, additional interconnect vias (not shown) are coupled to the first interconnect wires 112.

Figure 2:
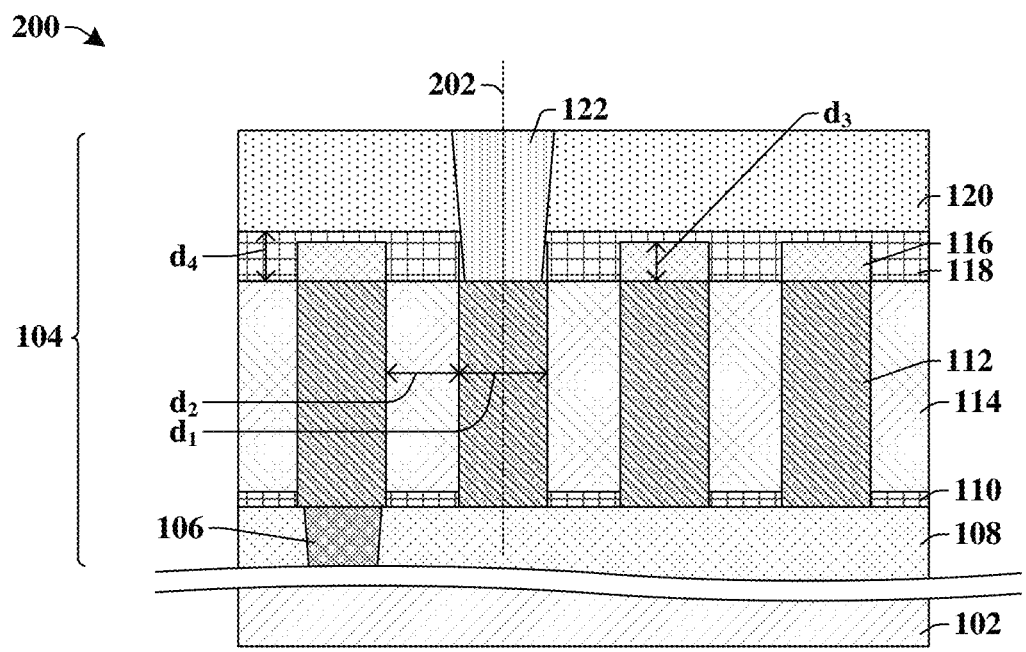
FIG. 2-5 illustrate cross-sectional views some alternative embodiments of an integrated chip having barrier structure arranged over a first interconnect wire, wherein an interconnect via extends through the barrier structure and/or an etch stop layer to contact the first interconnect wire.

FIG. 2 illustrates a cross-sectional view 200 of some embodiments of an integrated chip comprising an interconnect via extending through a barrier structure to contact a first interconnect wire, wherein the interconnect via is substantially centered over the first interconnect wire.

In some embodiments, a center of the first interconnect wire 112 that is arranged directly below the interconnect via 122 is arranged on a first line 202. In such embodiments, the first line 202 is perpendicular to a top surface of the substrate 102. In some embodiments, the center of the first interconnect wire 112 is determined to be a midpoint of a width of a topmost surface of the first interconnect wire 112. In some embodiments, a center of the interconnect via 122 is similarly determined to be a midpoint of a width of a topmost surface of the interconnect via 122. In some embodiments, as illustrated in the cross-sectional view 200 of FIG. 2, the first line 202 also intersects the center of the interconnect via 122. In such embodiments, the interconnect via 122 and the underlying first interconnect wire 112 may be classified as being "aligned" or "centered" with one another. Such embodiments, wherein the interconnect via 122 and the first interconnect wire 112 are aligned, the area of contact between the interconnect via 122 and the first interconnect wire 112 is increased. In such embodiments, an entirety of lower surfaces of the interconnect via 122 directly contacts the first interconnect wire 112.

However, in some embodiments, wherein the width (e.g., the first distance $d_1$) of the first interconnect wire 112 is so small (e.g., between about 5 nanometers and about 1000 nanometers), alignment between the interconnect via 122 and the underlying first interconnect wire 112 is rare due to processing limitations (e.g., photolithography precision, etching precision, etc.). Thus, the barrier structures 116 and the second etch stop layer 118 are still included over the first interconnect wires 112 in case of instances where the interconnect via 122 and the underlying first interconnect wire 112 are misaligned (e.g., FIGS. 1A and 3).

Further, it will be appreciated that in some other embodiments, even if the interconnect via 122 is centered over the underlying first interconnect wire 112, the interconnect via 122 may be wider than the underlying first interconnect wire 112 due to processing limitations. In such embodiments, the resulting interconnect via 122 may still have portions that directly overlie the first interconnect dielectric layer 114. However, in such embodiments, the portions of the interconnect via 122 that directly overlie the first interconnect dielectric layer 114 are spaced apart from the first interconnect dielectric layer 114 by the second etch stop layer 118.

Further, in some embodiments, the barrier structures 116 have a height equal to a third distance $d_3$. In some embodiments, the third distance $d_3$ is in a range of between, for example, approximately 10 angstroms and approximately 1000 angstroms. In some embodiments, the second etch stop layer 118 has a height equal to a fourth distance $d_4$. In some embodiments, the fourth distance $d_4$ is in a range of between, for example, approximately 10 angstroms and approximately 1100 angstroms. The fourth distance $d_4$ is greater than the third distance $d_3$ in some embodiments, so that the second etch stop layer 118 covers upper surfaces of the barrier structures 116. In some embodiments, the second etch stop layer 118 comprises a different material than the barrier structures 116 and the second interconnect dielectric layer 120. In some embodiments, the second etch stop layer 118 comprises, for example, silicon carbide, silicon dioxide, silicon oxygen carbide, silicon nitride, silicon carbon nitride, silicon oxynitride, silicon oxygen carbon nitride, aluminum oxynitride, aluminum oxide, or some other suitable material.

In some embodiments, the lower interconnect via 106, the first interconnect wires 112, and the interconnect via 122 may each comprise a conductive material, such as, for example, tantalum, tantalum nitride, titanium nitride, copper, cobalt, ruthenium, molybdenum, iridium, tungsten, or some other suitable conductive material. In some embodiments, the lower interconnect via 106, the first interconnect wires 112, and the interconnect via 122 may each comprise the same material, may each comprise a different material, or may comprise a combination of similar and different materials. In some embodiments, the lower interconnect via 106, the first interconnect wires 112, and the interconnect via 122 may each have a height in a range of between, for example, approximately 10 angstroms and approximately 1000 angstroms.

Figure 3:
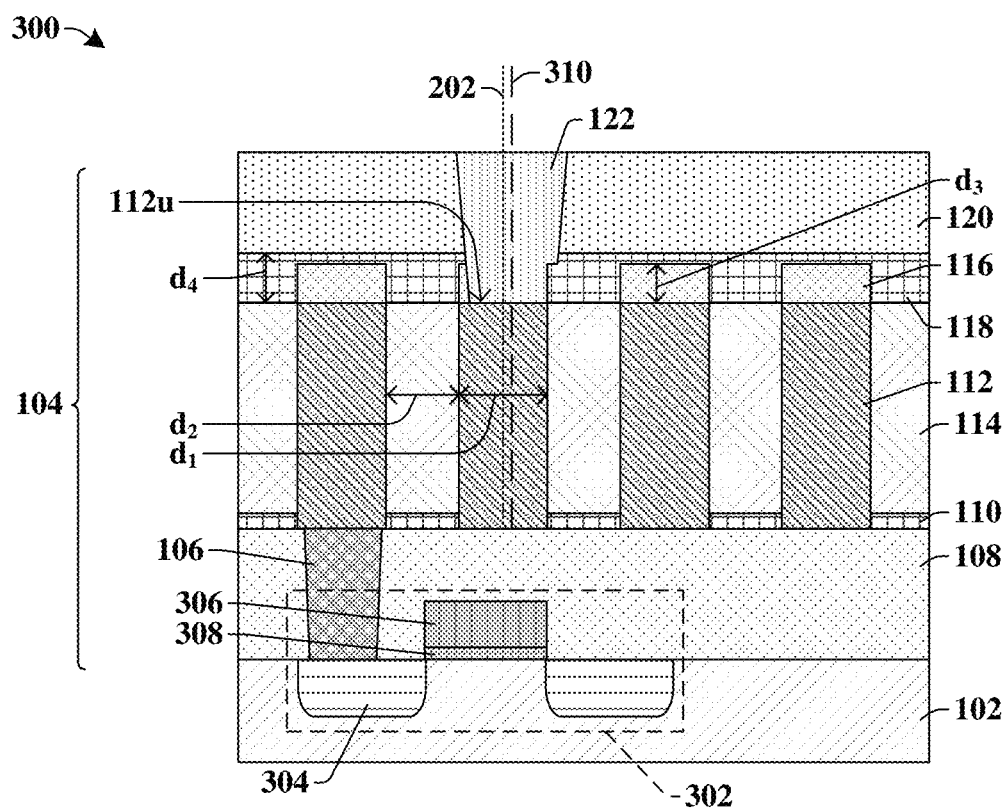

FIG. 3 illustrates a cross-sectional view 300 of some embodiments wherein an interconnect structure comprising barrier structures is coupled to an underlying semiconductor device.

In some embodiments, the interconnect via 122 is "misaligned" or "not centered" over the underlying first interconnect wire 112. In such embodiments, a second line 310 that is perpendicular to the top surface of the substrate 102 intersects the center of the interconnect via 122, and the second line 310 is parallel to the first line 202 that intersects the center of the first interconnect wire 112. In such embodiments, when the first line 202 is parallel with and does not intersect the second line 310, the interconnect via 122 is misaligned with the underlying first interconnect wire 112. In such embodiments, as described with respect to the cross-sectional view 100A of FIG. 1A, the barrier structures 116 and the second etch stop layer 118 aid in protecting the first interconnect dielectric layer 114 during the formation of the interconnect via 122, and thus, the interconnect via 122 does not extend below upper surfaces of the first interconnect wires 112.

Further, in some embodiments, the lower interconnect via 106 is coupled to an underlying semiconductor device 302. In some embodiments, the underlying semiconductor device 302 may comprise, for example, a field effect transistor (FET). In such embodiments, the semiconductor device 302 may comprise source/drain regions 304 arranged on or within the substrate 102. The source/drain regions 304 may comprise doped portions of the substrate 102. Further, in some embodiments, the semiconductor device 302 may comprise a gate electrode 306 arranged over the substrate 102 and between the source/drain regions 304. In some embodiments, a gate dielectric layer 308 may be arranged directly between the gate electrode 306 and the substrate 102. In some embodiments, the lower interconnect via 106 is coupled to one of the source/drain regions 304, whereas in other embodiments, the lower interconnect via 106 may be coupled to the gate electrode 306 of the semiconductor device 302. Further in some embodiments, it will be appreciated that the interconnect structure 104 may couple the semiconductor device 302 to some other semiconductor device, memory device, photo device, or some other electronic device. It will be appreciated that other electronic/semiconductor devices other than the FET illustrated as the semiconductor device 302 are also within the scope of this disclosure.

Figure 4:
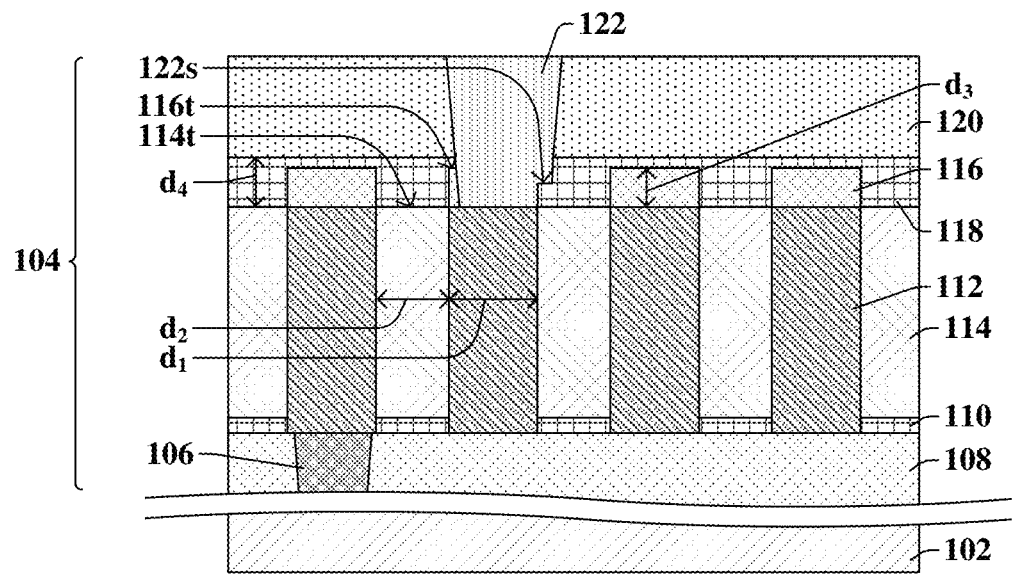

FIG. 4 illustrates a cross-sectional view 400 of some other embodiments of an integrated chip comprising an interconnect via extending through a barrier structure to contact a first interconnect wire.

In some embodiments, the horizontal surface 122s of the interconnect via 122 is arranged below a topmost surface 116t of the barrier structure 116. In such embodiments, the second removal process used to remove portions of the second etch stop layer 118 continues past the topmost surface 116t of the barrier structure 116. Thus, in some embodiments, the second removal process removes portions of the second etch stop layer 118 below the topmost surface 116t of the barrier structure 116. However, the second removal process is stopped before exposing the topmost surface 114t of the first interconnect dielectric layer 114. Thus, in some embodiments, the horizontal surface 122s of the interconnect via 122 is arranged above the topmost surface 114t of the first interconnect dielectric layer 114 but below the topmost surface 116t of the barrier structure 116. In some other embodiments, the horizontal surface 122s of the interconnect via 122 is arranged at a first height from the topmost surface 114t of the first interconnect dielectric layer 114 that is about equal to the third distance $d_3$ of the barrier structure 116.

Figure 5:
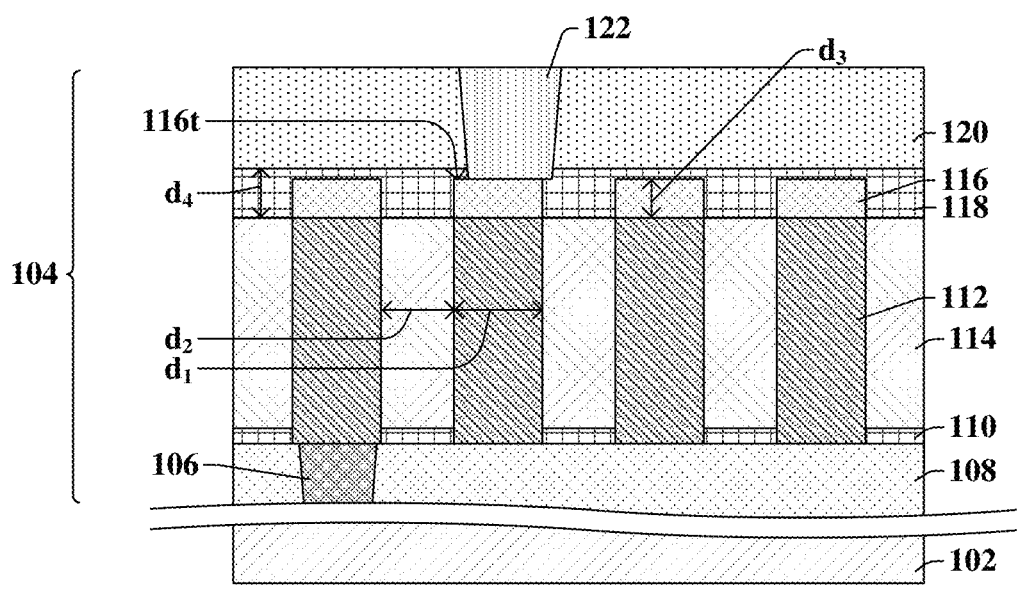

FIG. 5 illustrates a cross-sectional view 500 of some embodiments of an integrated chip comprising an interconnect via extending through a second etch stop layer to contact a barrier structure and an underlying interconnect wire.

In some embodiments, a third removal process used to remove portions of the barrier structure 116 may be omitted, and the interconnect via 122 may extend through the second interconnect dielectric layer 120 and the second etch stop layer 118 to directly contact the topmost surface 116t of the barrier structure 116. In such embodiments, the barrier structure 116 may comprise a conductive material such that the barrier structure 116 does not compromise the electrical connection between the interconnect via 122 and the first interconnect wire 112. In some other embodiments, the barrier structure 116 could comprise a dielectric material, but capacitance between the interconnect via 122 and the first interconnect wire 112 from the barrier structure 116 may compromise (e.g., reduce speed, change the value of the signal transferred, etc.) the electrical connection between the first interconnect wire 112 and the interconnect via 122. However, manufacturing efficiency is increased when the third removal process is omitted, and the barrier structure 116 remains directly between the interconnect via 122 and the first interconnect wire 112.

FIGS. 6-16 illustrate various views 600-1600 of some embodiments of a method of forming an interconnect via over a first interconnect wire using barrier structures and a second etch stop layer on the first interconnect wire to increase a processing window for formation of the interconnect via. Although FIGS. 6-16 are described in relation to a method, it will be appreciated that the structures disclosed in FIGS. 6-16 are not limited to such a method, but instead may stand alone as structures independent of the method.

Figure 6:
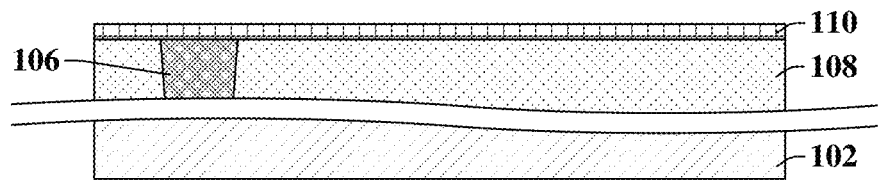
FIGS. 6-16 illustrate various views of some embodiments of a method of forming an integrated chip having a barrier structure arranged over a first interconnect wire and an etch stop layer arranged over the barrier structure, wherein the barrier structures aids in preventing an overlying interconnect via from being formed below a topmost surface of the first interconnect wire.

As shown in cross-sectional view 600 of FIG. 6, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated with. In some embodiments, a lower interconnect dielectric layer 108 is formed over the substrate 102. In some embodiments, various semiconductor devices (e.g., transistors, inductors, capacitors, etc.) and/or memory devices (not shown) may be arranged over and/or within the substrate 102 and beneath the lower interconnect dielectric layer 108. In some embodiments, a lower interconnect via 106 may be formed within the lower interconnect dielectric layer 108 and coupled to the one or more of the various semiconductor devices and/or memory devices (not shown).

In some embodiments, the lower interconnect dielectric layer 108 may be formed by way of a deposition process (e.g., spin-on, physical vapor deposition (PVD), chemical vapor deposition (CVD), atomic layer deposition (ALD), etc.). In some embodiments, the lower interconnect dielectric layer 108 may have a thickness in a range of between, for example, approximately 30 angstroms and approximately 800 angstroms. In some embodiments, the lower interconnect dielectric layer 108 may comprise, for example, a low-k dielectric material such as silicon carbide, silicon dioxide, silicon oxygen carbide, silicon nitride, silicon carbon nitride, silicon oxynitride, silicon oxygen carbon nitride, or some other suitable dielectric material.

In some embodiments, the lower interconnect via 106 may be formed within the lower interconnect dielectric layer 108 through various steps of patterning (e.g., photolithography/etching), deposition (e.g., PVD, CVD, plasma-enhanced CVD (PE-CVD), ALD, sputtering, etc.), and removal (e.g., wet etching, dry etching, chemical mechanical planarization (CMP), etc.) processes. In some embodiments, the lower interconnect via 106 may comprise a conductive material such as, for example, tantalum, tantalum nitride, titanium nitride, copper, cobalt, ruthenium, molybdenum, iridium, tungsten, or some other suitable conductive material. Further, in some embodiments, the lower interconnect via 106 may have a height in a range of between, for example, approximately 10 angstroms and approximately 1000 angstroms.

In some embodiments, a first etch stop layer 110 is formed over the lower interconnect via 106 and over the lower interconnect dielectric layer 108. In some embodiments, the first etch stop layer 110 is formed by way of a deposition process (e.g., PVD, CVD, ALD, spin-on, etc.), and may be formed in a chamber set to a temperature in a range of between, for example, approximately 150 degrees Celsius and approximately 400 degrees Celsius. In some embodiments, the first etch stop layer 110 may be formed to have a thickness in a range of between, of example, approximately 10 angstroms and approximately 1000 angstroms. In some embodiments, the first etch stop layer 110 may comprise, for example, silicon carbide, silicon dioxide, silicon oxygen carbide, silicon nitride, silicon carbon nitride, silicon oxynitride, silicon oxygen carbon nitride, aluminum oxygen nitride, aluminum oxide, or some other suitable material.

Figure 7:
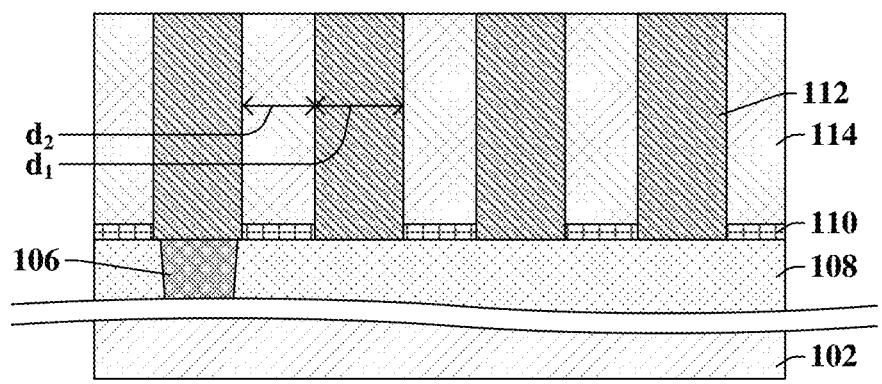

As shown in cross-sectional view 700 of FIG. 7, in some embodiments, first interconnect wires 112 embedded in a first interconnect dielectric layer 114 are formed over the first etch stop layer 110. In some embodiments, the first interconnect dielectric layer 114 may first be formed over the first etch stop layer 110, and then the first interconnect dielectric layer 114 may undergo various steps of patterning (e.g., photolithography/etching), deposition (e.g., PVD, CVD, PE-CVD, ALD, sputtering, etc.), and removal (e.g., wet etching, dry etching, CMP, etc.) processes to form the first interconnect wires 112 within the first interconnect dielectric layer 114. In other embodiments, the first interconnect wires 112 may first be formed over the first etch stop layer 110 through various steps of patterning (e.g., photolithography/etching), deposition (e.g., PVD, CVD, PE-CVD, ALD, sputtering, etc.), and removal (e.g., wet etching, dry etching, CMP, etc.) processes, and then the first interconnect dielectric layer 114 may be formed around the first interconnect wires 112.

Nevertheless, in some embodiments, the first interconnect dielectric layer 114 is formed by way of a deposition process (e.g., spin-on, PVD, CVD, ALD, etc.) in a chamber set to a temperature in a range of between approximately 50 degrees Celsius and approximately 400 degrees Celsius. In some embodiments, the first interconnect dielectric layer 114 may be formed to a thickness in a range of between, for example, approximately 10 angstroms and approximately 1000 angstroms. In some embodiments, the first interconnect dielectric layer 114 may comprise a low-k dielectric material such as, for example, silicon carbide, silicon dioxide, silicon oxygen carbide, silicon nitride, silicon carbon nitride, silicon oxynitride, silicon oxygen carbon nitride, or some other suitable dielectric material.

Further, in some embodiments, the first interconnect wires 112 may be formed by way of a deposition process (e.g., spin-on, PVD, CVD, ALD, etc.) in a chamber set to a temperature in a range of between approximately 150 degrees Celsius and approximately 400 degrees Celsius. In some embodiments, the first interconnect wires 112 may have a height equal to the height of the first interconnect dielectric layer 114. Thus, in some embodiments, the first interconnect wires 112 have a height in a range of between approximately 10 angstroms and approximately 1000 angstroms. Further, in some embodiments, the first interconnect wires 112 each have a width equal to a first distance $d_1$ in a range of between, for example, approximately 5 nanometers and approximately 1000 nanometers. In some embodiments, the first interconnect wires 112 may be spaced apart from one another by a second distance $d_2$ in a range of between, for example, approximately 5 nanometers and approximately 1000 nanometers. In some embodiments, the first interconnect wires 112 may comprise a conductive material, such as, for example, tantalum, tantalum nitride, titanium nitride, copper, cobalt, ruthenium, molybdenum, iridium, tungsten, or some other suitable conductive material.

In some embodiments, one or more of the first interconnect wires 112 extend through the first etch stop layer 110 to directly contact one or more lower interconnect vias 106. Thus, in some embodiments, the formation of the first interconnect wires 112 also includes removing portions of the first etch stop layer 110. It will be appreciated that more or less than 4 first interconnect wires 112 may be present in the first interconnect dielectric layer 114.

Figure 8:
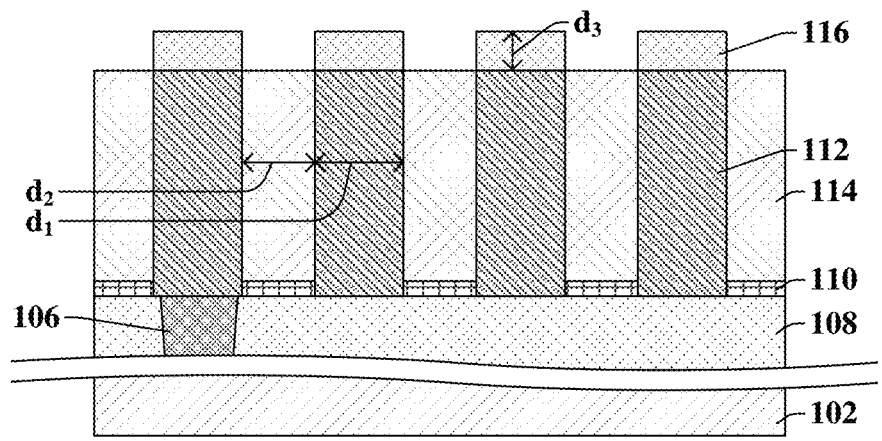

As shown in cross-sectional view 800 of FIG. 8, in some embodiments, barrier structures 116 are selectively formed over the first interconnect wires 112. In such embodiments, the barrier structures 116 comprise a material that may be selectively deposited directly on the first interconnect wires 112 but is not deposited on the first interconnect dielectric layer 114. Because the barrier structures 116 may be selectively formed directly on the first interconnect wires 112 and not on the first interconnect dielectric layer 114, photolithography processes may be omitted, thereby increasing manufacturing efficiency of forming the barrier structures 116. In some embodiments, the barrier structures 116 may comprise, for example, hafnium oxide, lithium niobium oxide, lithium nitrogen oxide, magnesium oxide, manganese oxide, molybdenum oxide, niobium oxide, nitrogen oxide, silicon oxide, silicon oxygen carbide, silicon oxygen carbon nitride, silicon oxynitride, silicon carbide, tin oxide, tin silicon oxide, strontium oxide, tantalum oxide, tantalum oxynitride, titanium oxide, titanium oxynitride, tungsten oxide, zinc oxide, zirconium oxide, or some other suitable dielectric material or metal-oxide. In such embodiments, the barrier structures 116 may be formed by way of a deposition process (e.g., PVD, CVD, ALD, spin-on, etc.) in a chamber set to a temperature in a range of between, for example, approximately 150 degrees Celsius and approximately 400 degrees Celsius.

In some other embodiments, the barrier structures 116 may comprise, for example, tantalum, tantalum nitride, titanium nitride, copper, cobalt, ruthenium, molybdenum, iridium, tungsten or some other suitable metal. The barrier structures 116 may, in some embodiments, comprise a different material than the first interconnect wires 112. In such other embodiments, the barrier structures 116 may be formed by way of a deposition process (e.g., PVD, CVD, ALD, electrochemical plating, spin-on, etc.) in a chamber set to a temperature in a range of between, for example, approximately 20 degrees Celsius and approximately 400 degrees Celsius.

In some embodiments, the barrier structures 116 have a height equal to the third distance $d_3$ that is in a range of between, for example, approximately 10 angstroms and approximately 1000 angstroms.

Figure 9:
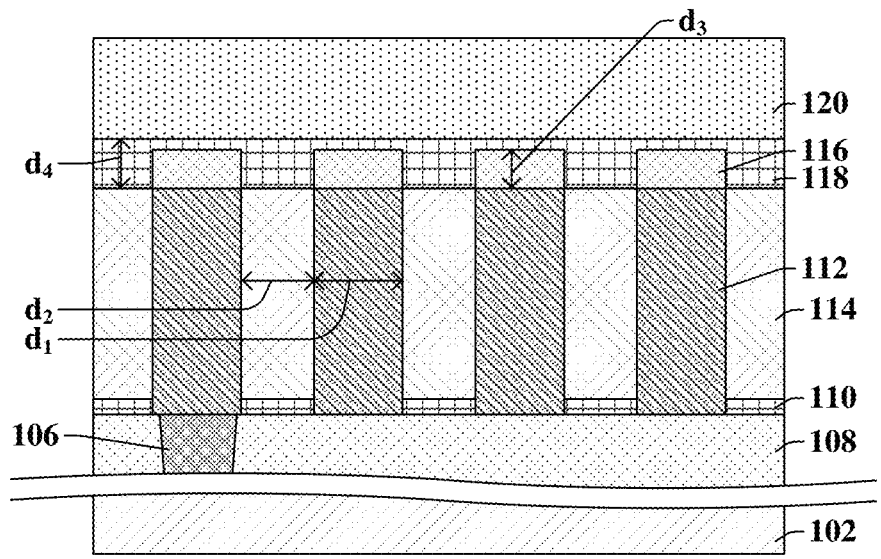

As shown in cross-sectional view 900 of FIG. 9, in some embodiments, a second etch stop layer 118 is formed over the barrier structures 116 and over the first interconnect dielectric layer 114. In some embodiments, the second etch stop layer 118 has a maximum thickness equal to a fourth distance $d_4$ that is greater than the third distance $d_3$ such that the second etch stop layer 118 completely covers the barrier structures 116. In some embodiments, the fourth distance $d_4$ is in a range of between, for example, approximately 10 angstroms and approximately 1000 angstroms. In some embodiments, the second etch stop layer 118 may be formed by way of, for example, a deposition process (e.g., PVD, CVD, ALD, spin-on, etc.) in a chamber set to a temperature of between, for example, approximately 150 degrees Celsius and approximately 400 degrees Celsius. In some embodiments, after the deposition process, a removal process (e.g., chemical mechanical planarization (CMP)) is performed such that the second etch stop layer 118 has an upper surface that is substantially planar. In some embodiments, the second etch stop layer 118 may comprise a material that is different than the barrier structures 116. Further, in some embodiments, the second etch stop layer 118 comprises a material that is different than the first interconnect dielectric layer 114. In some embodiments, the second etch stop layer 118 may comprise, for example, silicon carbide, silicon dioxide, silicon oxygen carbide, silicon nitride, silicon carbon nitride, silicon oxynitride, silicon oxygen carbon nitride, aluminum oxynitride, aluminum oxide, or some other suitable material.

Further, in some embodiments, a second interconnect dielectric layer 120 is formed over the second etch stop layer 118. In some embodiments, the second interconnect dielectric layer 120 is formed by way of a deposition process (e.g., PVD, CVD, ALD, spin-on, etc.) in a chamber set to a temperature in a range of between, for example, approximately 50 degrees Celsius and approximately 400 degrees Celsius. In some embodiments, the second interconnect dielectric layer 120 comprises a dielectric material such as, for example, silicon carbide, silicon dioxide, silicon oxygen carbide, silicon nitride, silicon carbon nitride, silicon oxynitride, silicon oxygen carbon nitride, or some other suitable dielectric material. In some embodiments, the second interconnect dielectric layer 120 comprises a same material as the first interconnect dielectric layer 114. In other embodiments, the second interconnect dielectric layer 120 may comprise a different material than the first interconnect dielectric layer 114. In some embodiments, the second interconnect dielectric layer 120 comprises a different material than the second etch stop layer 118. In some embodiments, the second interconnect dielectric layer 120 has a thickness in a range of between, for example, approximately 30 angstroms and approximately 800 angstroms.

Figure 10:
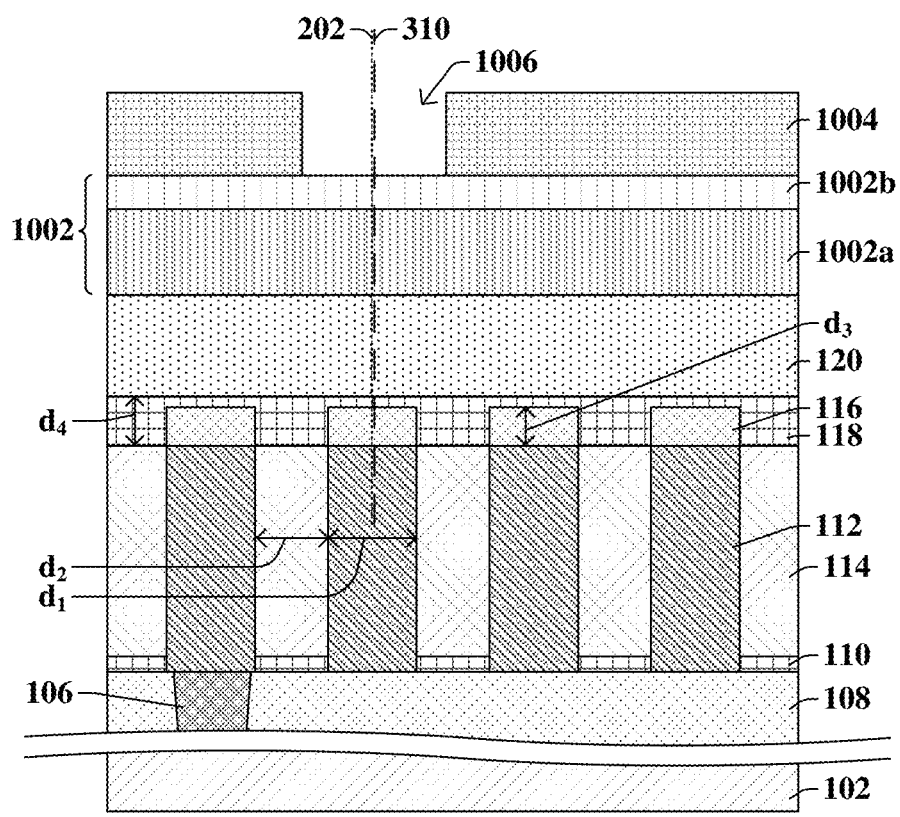

As shown in cross-sectional view 1000 of FIG. 10, in some embodiments, an anti-reflective structure 1002 may be formed over the second interconnect dielectric layer 120. In some embodiments, the anti-reflective structure 1002 may comprise, for example, a first anti-reflective layer 1002a and a second anti-reflective layer 1002b. In some embodiments, the anti-reflective structure 1002 aids in precision and accuracy of future patterning/photolithography processes. In some embodiments, the anti-reflective structure 1002 is formed by way of a deposition process (e.g., spin-on, CVD, PVD, ALD, etc.) and comprises organic and/or inorganic materials. In some embodiments, a first masking structure 1004 is formed over the anti-reflective structure 1002 by using photolithography and removal (e.g., etching) processes. In some embodiments, the first masking structure 1004 comprises a photoresist or hard mask material.

In some embodiments, the first masking structure 1004 comprises an opening 1006 arranged directly over one of the first interconnect wires 112. In some embodiments, a first line 202 intersects a center of the first interconnect wire 112 that directly underlies the opening 1006 of the first masking structure 1004. In some embodiments, a second line 310 intersects a center of the opening 1006 of the first masking structure 1004. In some embodiments, the center of the first interconnect wire 112 may be defined as a midpoint of a width of the first interconnect wire 112, and similarly, the center of the opening 1006 may be defined as a midpoint of a width of the opening 1006. In some embodiments, the first line 202 and the second line 310 are perpendicular to a topmost surface of the substrate 102.

In some embodiments, due to photolithography precision and/or accuracy limitations, for example, the first line 202 may be offset from the second line 310. In such embodiments, the opening 1006 may directly overlie a portion of the first interconnect dielectric layer 114. In such embodiments, the opening 1006 of the first masking structure 1004 may be determined to be "misaligned" with the underlying one of the first interconnect wires 112.

In some other embodiments, the first line 202 may be collinear with the second line 310, and the opening 1006 may directly overlie only the underlying one of the first interconnect wires 112. In such other embodiments, the opening 1006 may be determined to be aligned with the underlying one of the first interconnect wires 112. In yet other embodiments, the first line 202 may be collinear with the second line 310, but a width of the opening 1006 may be greater than a width of the first interconnect wire 112. In such other embodiments, the opening 1006 may still directly overlie portions of the first interconnect dielectric layer 114. In some embodiments, a width of the opening 1006 may be in a range of between, for example, approximately 5 nanometers and approximately 300 nanometers.

Figure 11:
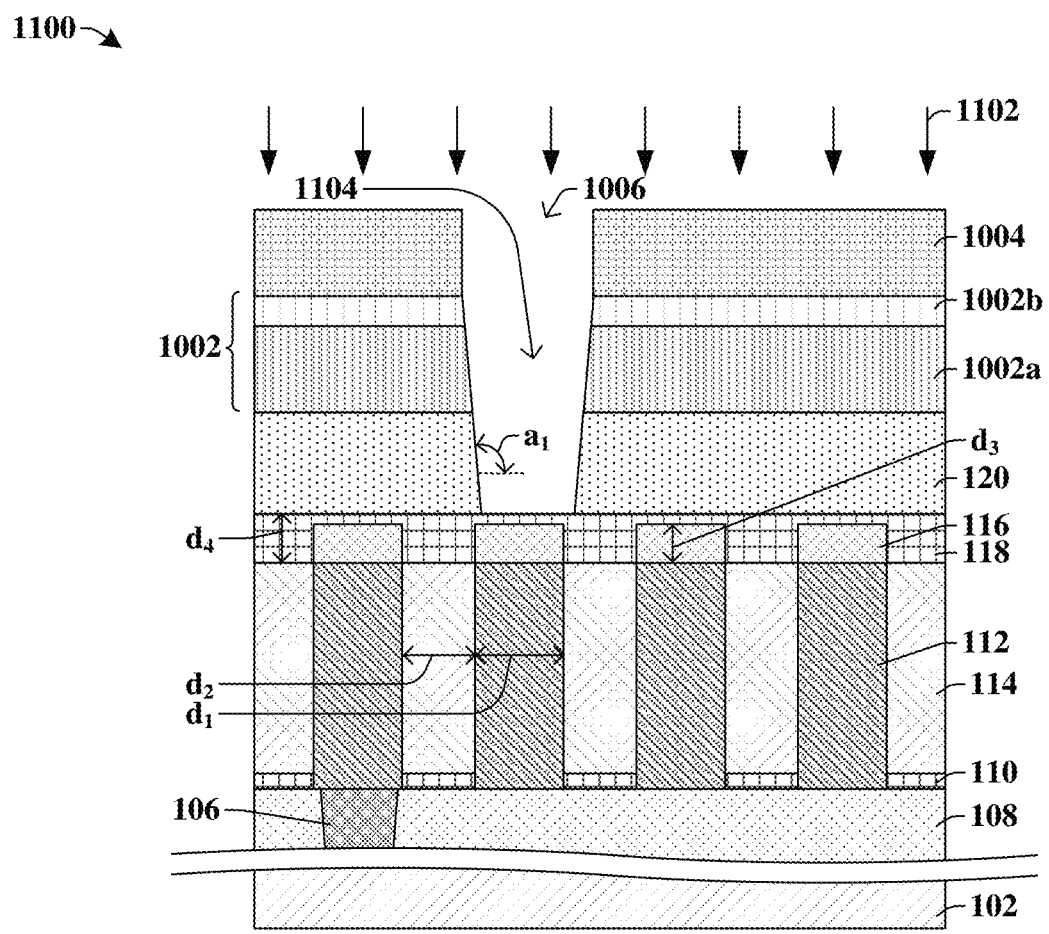

As shown in cross-sectional view 1100 of FIG. 11, in some embodiments, a first removal process 1102 may be performed to remove portions of the anti-reflective structure 1002 and the second interconnect dielectric layer 120 that directly underlie the opening 1006 of the first masking structure 1004. In some embodiments, the first removal process 1102 may form a cavity 1104 that extends through the anti-reflective structure 1002 and the second interconnect dielectric layer 120 to expose the second etch stop layer 118 arranged directly below the opening 1006 of the first masking structure 1004. Thus, in some embodiments, the second etch stop layer 118 comprises a material that is different than the second interconnect dielectric layer 120, and comprises a material that is substantially resistant to removal by the first removal process 1102. In some embodiments, the cavity 1204 may have sidewalls angled at a first angle $a_1$. In some embodiments, the first angle $a_1$ may be in a range of between, for example, approximately 90 degrees and approximately 130 degrees.

In some embodiments, the first removal process 1102 comprises one or more dry etchants used to remove the portions of the anti-reflective structure 1002 and the second interconnect dielectric layer 120. In some embodiments, the first removal process 1102 may be or comprise reactive-ion etching, inductively coupled plasma, and/or capacitively coupled plasma. In such embodiments, the first removal process 1102 may utilize one or more of the following gas etchants: a carbon-hydrogen gas (e.g., $CH_4$), a fluoride-based gas (e.g., $CH_3F$, $CH_2F_2$, $CHF_3$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the first removal process 1102 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

As shown in cross-sectional view 1200 of FIG. 12, in some embodiments, a second removal process 1202 is performed to remove portions of the second etch stop layer 118 arranged below the opening 1006 of the first masking structure 1004. Thus, the second removal process 1202 extends the cavity 1104 and exposing a topmost surface 116$t$ of the barrier structure 116 that directly underlies the opening 1006 of the first masking structure 1004. In some embodiments, the barrier structures 116 comprise a material that is substantially resistant to removal by the second removal process 1202. In some embodiments, the etching selectivity between the second etch stop layer 118 and the barrier structures 116 by the second removal process 1202 is between about 10 and 30. In other words, the second etch stop layer 118 may be removed by the second removal process 1202 at a rate that is 10 to 30 times faster than removal of the barrier structures 116 by the second removal process 1202.

In some embodiments, even if the opening 1006 of the first masking structure 1004 directly overlies the first interconnect dielectric layer 114, after the second removal process 1202, the second etch stop layer 118 still completely covers the first interconnect dielectric layer 114. Thus, in some embodiments, the second etch stop layer 118 may be controlled by, for example, a predetermined etching time to remove enough of the second etch stop layer 118 to expose the topmost surface 116$t$ of the barrier structure 116 but without removing the entire thickness (i.e., the fourth distance $d_4$) of the second etch stop layer 118 to prevent exposure of the first interconnect dielectric layer 114. Thus, in some embodiments, a mid-surface 118$s$ of the second etch stop layer 118 is formed by the second removal process 1202, wherein the mid-surface 118$s$ is between the topmost surface 116$t$ of the barrier structure 116 and a topmost surface 114$t$ of the first interconnect dielectric layer 114. In some embodiments, the second removal process 1202 comprises a different etchant than the first removal process 1102.

In some embodiments, the second removal process 1202 may be or comprise reactive-ion etching, remote plasma, inductively coupled plasma, and/or capacitively coupled plasma. In such embodiments, the second removal process 1202 may utilize one or more of the following gas etchants: a carbon-hydrogen gas (e.g., $CH_4$), a fluoride-based gas (e.g., $CH_3F$, $CH_2F_2$, $CHF_3$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the second removal process 1202 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

In some other embodiments, the second removal process 1202 may comprise a wet etchant to remove the second etch stop layer 118 according to the cavity 1104 of FIG. 11 and the opening 1006 of the first masking structure 1004. In some embodiments, when the second removal process 1202 comprises a wet etchant, the wet etchant of the second removal process 1202 may also remove the first masking structure 1004 and/or the anti-reflective structure 1002. In yet other embodiments, a different wet etchant than what is used for the second removal process 1202 may be used before or after the second removal process 1202 to remove the first masking structure 1004 and the anti-reflective structure 1002.

Figure 12:
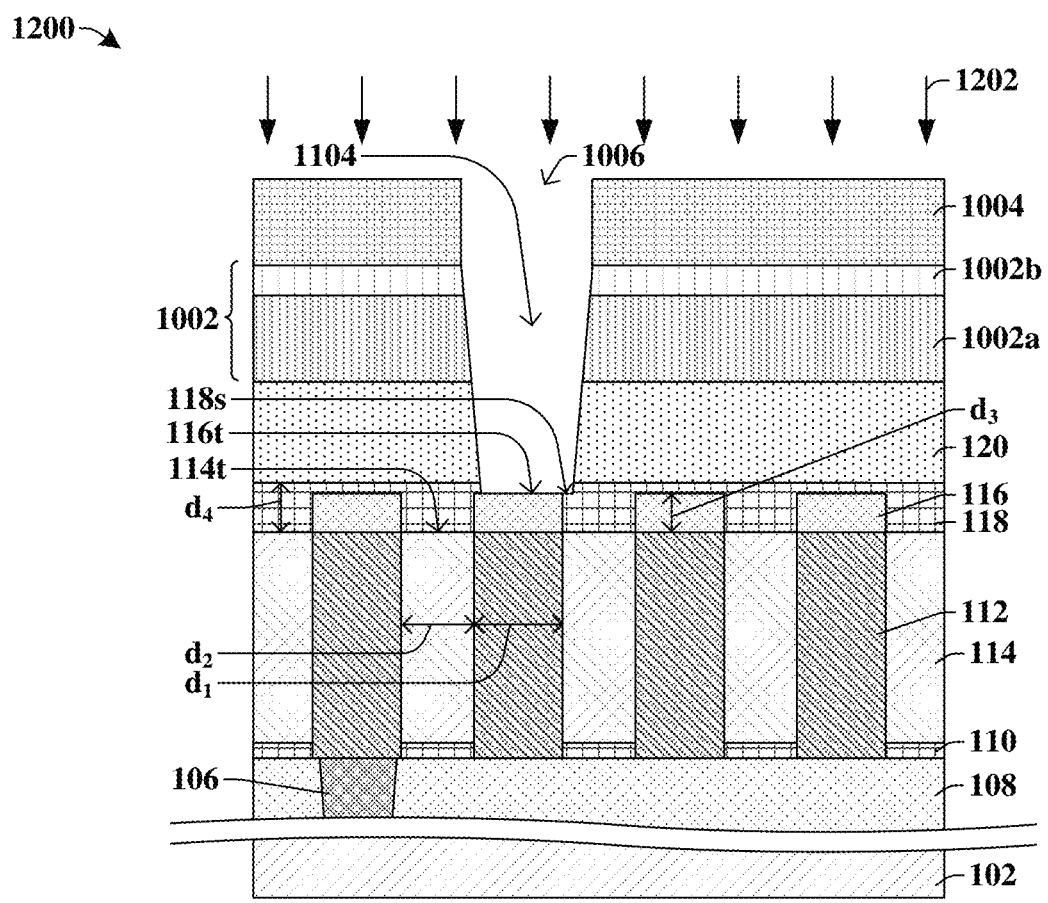
Figure 13:
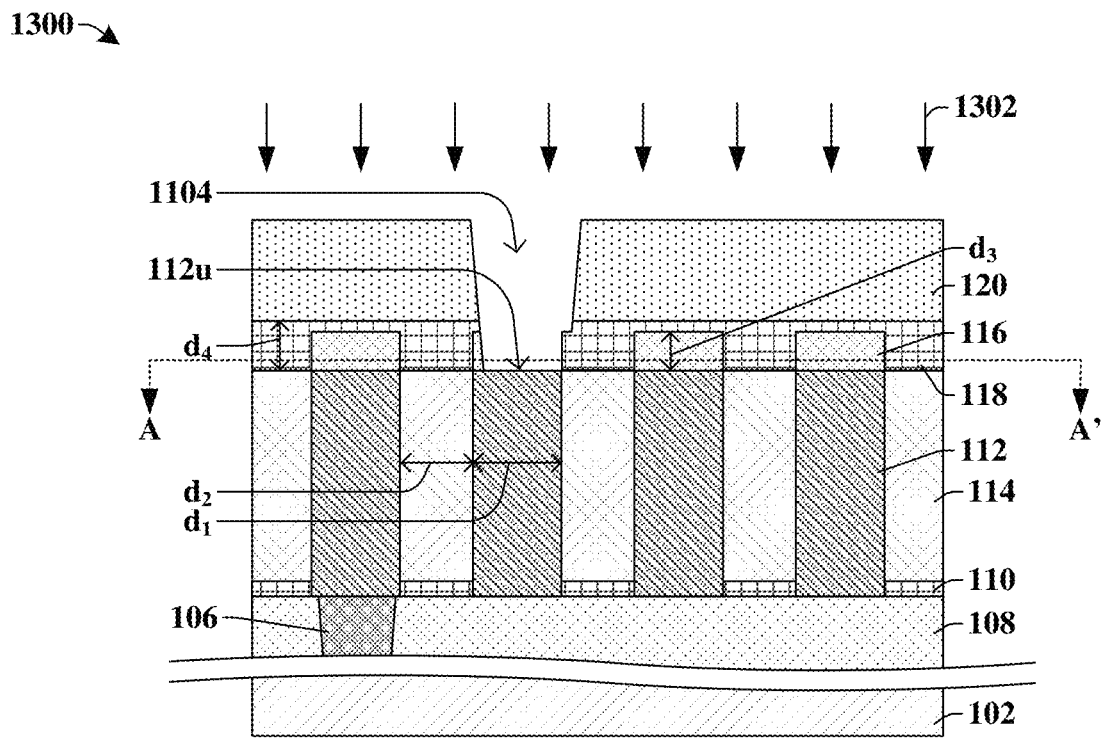

As shown in cross-sectional view 1300 of FIG. 13, in some embodiments, a third removal process 1302 may be performed to remove portions of the barrier structure 116 that directly underlie the opening (1006 of FIG. 12) of the first masking structure (1004 of FIG. 12). Thus, the third removal process 1302 extends the cavity 1104 to expose an upper surface 112$u$ of the first interconnect wire 112. In some embodiments, prior to the third removal process 1302 the anti-reflective structure (1002 of FIG. 12) and the first masking structure (1004 of FIG. 12) are removed by way of a wet or dry etchant. In other embodiments, the anti-reflective structure (1002 of FIG. 12) and the first masking structures (1004 of FIG. 12) are removed by way of a wet or dry etchant after the third removal process 1302.

In some embodiments, the third removal process 1302 comprises a different etchant than the second removal process (1202 of FIG. 12) such that the second etch stop layer 118 is substantially resistant to removal by the third removal process 1302. Thus, the second etch stop layer 118 may protect the first interconnect dielectric layer 114 from removal by the third removal process 1302. Further, in some embodiments, the second interconnect dielectric layer 120 acts as a masking structure during the third removal process 1302. Thus, the third removal process 1302 is different than the first removal process (1102 of FIG. 11) so that the second interconnect dielectric layer 120 is substantially removal to resistant by the third removal process 1302. In addition, in some embodiments, the first interconnect wires 112 are substantially resistant to removal by the third removal process 1302. Thus, in some embodiments, the first interconnect wires 112 comprise a different material than the barrier structures 116.

In some embodiments, the third removal process 1302 may be or comprise reactive-ion etching, remote plasma, inductively coupled plasma, and/or capacitively coupled plasma. In such embodiments, the third removal process 1302 may utilize one or more of the following gas etchants: a carbon-hydrogen gas (e.g., $CH_4$), a fluoride-based gas (e.g., $CH_3F$, $CH_2F_2$, $CHF_3$, $C_4F_8$, $C_4F_6$, $CF_4$), hydrogen bromide, a carbon monoxide, carbon dioxide, boron trichloride, chlorine, nitrogen, helium, neon, argon, or some other suitable gas. In some embodiments, the third removal process 1302 may be conducted in a chamber set to a temperature in a range of between approximately 0 degrees Celsius and approximately 100 degrees Celsius; to a pressure in a range of between approximately 0.2 millitorr and approximately 120 millitorr; to a power in a range of between approximately 50 watts and approximately 3000 watts; and to a bias in a range of between approximately 0 volts and approximately 1200 volts.

In some other embodiments, the third removal process 1302 may comprise a wet etchant to remove the portions of the barrier structure 116 to expose the upper surface 112u of the first interconnect wire 112. In yet other embodiments, the third removal process 1302 may be omitted and an overlying interconnect via to be formed within the cavity 1104 may be coupled to the first interconnect wire 112 through the barrier structure (e.g., FIG. 5).

Figure 14:
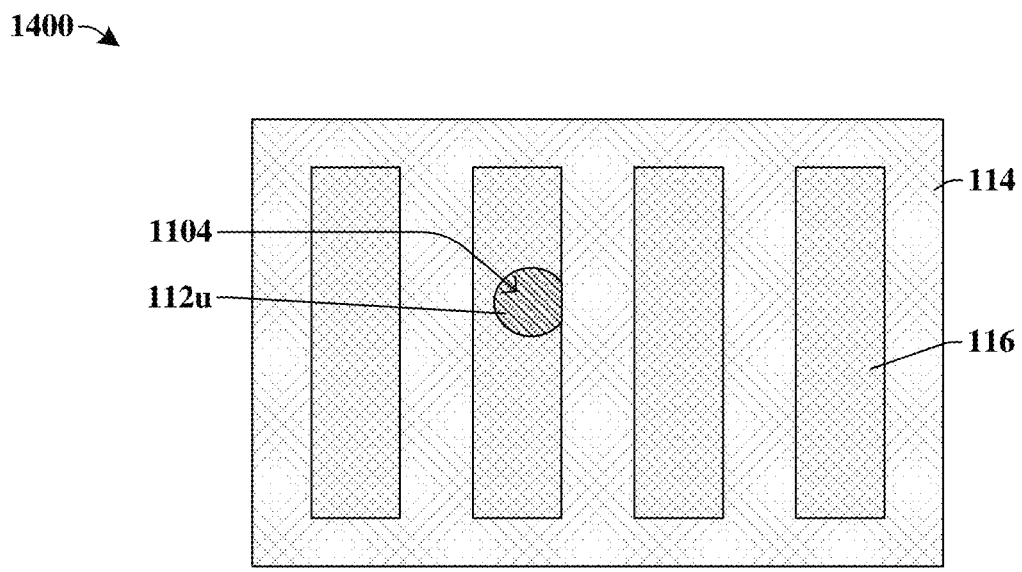

FIG. 14 illustrates a top-view 1400 of some embodiments corresponding to cross-section line AA' of FIG. 13.

The top-view 1400 of FIG. 14 illustrates that the cavity 1104 extends through the barrier structure 116 to expose the upper surface 112u of the first interconnect wire (112 of FIG. 13). Further, it will be appreciated that other cavities (not shown) may have been formed simultaneously with the cavity 1104, such that other cavities (not shown) expose upper surfaces of other ones of the first interconnect wires (112 of FIG. 13) arranged beneath the barrier structures 116.

Figure 15:
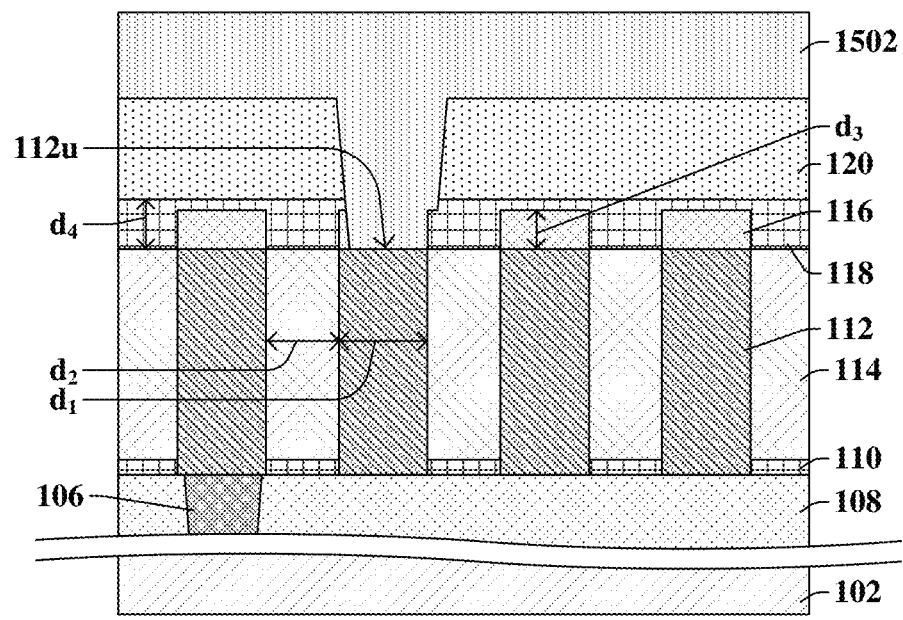

As shown in cross-sectional view 1500 of FIG. 15, in some embodiments, a conductive material 1502 is formed on the second interconnect dielectric layer 120 to completely fill the cavity (1104 of FIG. 13) in the second interconnect dielectric layer 120, the second etch stop layer 118, and the barrier structure 116 to contact the upper surface 112u of the first interconnect wire 112. In some embodiments, the conductive material 1502 may comprise, for example, tantalum, tantalum nitride, titanium nitride, copper, cobalt, ruthenium, molybdenum, iridium, tungsten, or some other suitable conductive material. Further, in some embodiments, the conductive material 1502 may be formed by way of a deposition process (e.g., PVD, CVD, ALD, spin-on, etc.) in a chamber set to a temperature of between, for example, approximately 150 degrees Celsius and approximately 400 degrees Celsius. In some embodiments, the thickness of the conductive material 1502 may be in a range of between, for example, approximately 10 angstroms and approximately 1000 angstroms.

Figure 16:
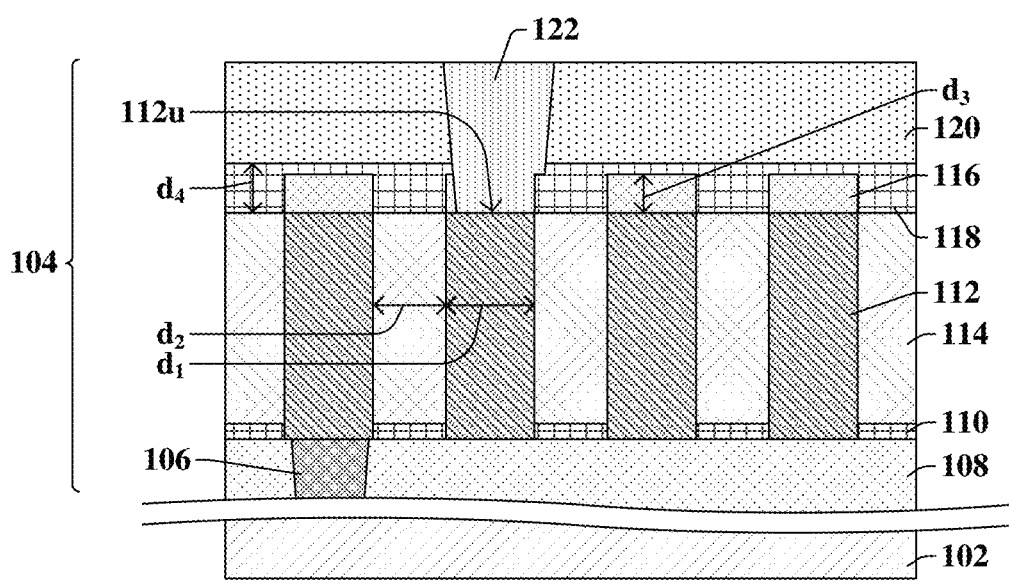

As shown in cross-sectional view 1600 of FIG. 16, in some embodiments, a removal process is performed to remove portions of the conductive material (1502 of FIG. 15) arranged over a topmost surface of the second interconnect dielectric layer 120, thereby forming an interconnect via 122 arranged over and coupled to the first interconnect wire 112. In some embodiments, the removal process of FIG. 16 comprises a planarization process (e.g., CMP). In some embodiments, the lower interconnect via 106, the first interconnect wires 112, and the interconnect via 122 make up an interconnect structure 104 overlying the substrate 102 and providing conductive pathways between various electronic devices (e.g., semiconductor devices, photo devices, memory devices, etc.) arranged above and below the interconnect structure 104.

In some embodiments, at least because of the barrier structures 116 and the second etch stop layer 118, the first interconnect dielectric layer 114 is not exposed and removed during the formation of the cavity (1104 of FIG. 13) to form the interconnect via 122. Thus, the interconnect via 122 does not extend below the first interconnect wire 112, and the interconnect via 122 does not extend directly between adjacent ones of the first interconnect wires 112. Thus, the barrier structures 116 provide a larger processing window for the formation of the interconnect via 122 because even if the interconnect via 122 is misaligned over the first interconnect wire 112, isolation between the first interconnect wires 112 provided by the first interconnect dielectric layer 114 is maintained. Thus, the barrier structures 116 and the second etch stop layer 118 increase the processing window for the formation of the interconnect via 122 without sacrificing isolation between underlying first interconnect wires 112 in order to provide a high-performance and reliable integrated chip.

Figure 17:
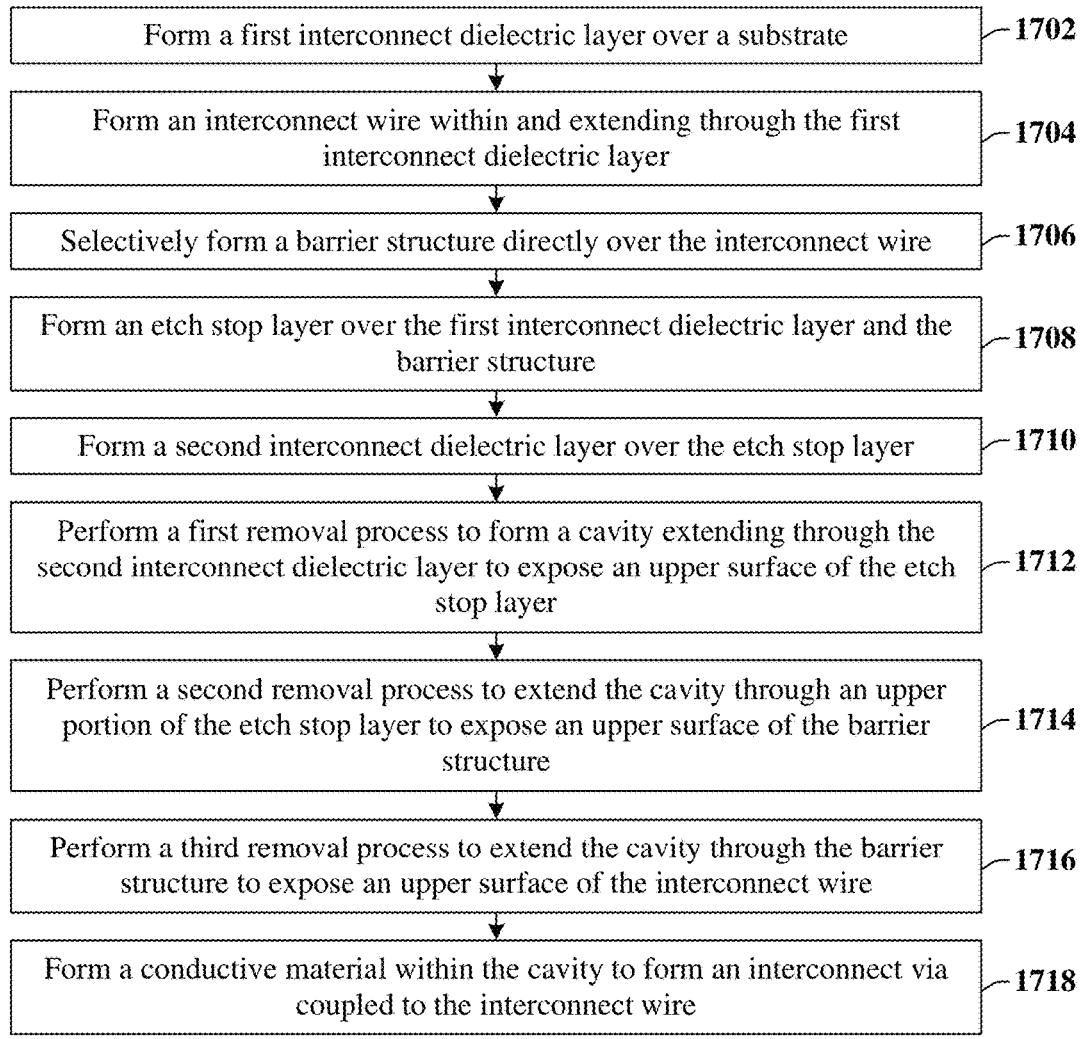
FIG. 17 illustrates a flow diagram of some embodiments corresponding to the method illustrated in FIGS. 6-16.

FIG. 17 illustrates a flow diagram of some embodiments of a method 1700 corresponding to the method illustrated in FIGS. 6-16.

While method 1700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1702, a first interconnect dielectric layer is formed over a substrate.

At act 1704, an interconnect wire is formed within and extends through the first interconnect dielectric layer. FIG. 7 illustrates a cross-sectional view 700 of some embodiments corresponding to acts 1702 and 1704.

At act 1706, a barrier structure is selectively formed directly over the interconnect wire. FIG. 8 illustrates a cross-sectional view 800 of some embodiments corresponding to act 1706.

At act 1708, an etch stop layer is formed over the first interconnect dielectric layer and the barrier structure.

At act 1710, a second interconnect dielectric layer is formed over the etch stop layer. Fig. illustrates a cross-sectional view 00 of some embodiments corresponding to act. FIG. 9 illustrates a cross-sectional view 900 of some embodiments corresponding to acts 1708 and 1710.

At act 1712, a first removal process is performed to form a cavity that extends through the second interconnect dielectric layer to expose an upper surface of the etch stop layer. FIG. 11 illustrate cross-sectional view 1100 of some embodiments corresponding to act 1712.

At act 1714, a second removal process is performed to extend the cavity through an upper portion of the etch stop layer to expose an upper surface of the barrier structure. FIG. 12 illustrates a cross-sectional view 1200 of some embodiments corresponding to act 1714.

At act 1716, a third removal process is performed to extend the cavity through the barrier structure to expose an upper surface of the interconnect wire. FIG. 13 illustrates a cross-sectional view 1300 of some embodiments corresponding to act 1716.

At act 1718, a conductive material is formed within the cavity to form an interconnect via coupled to the interconnect wire. FIG. 16 illustrates a cross-sectional view 1600 of some embodiments corresponding to act 1718.

Therefore, the present disclosure relates to a method of forming an interconnect via over an interconnect wire, wherein a barrier structure and an etch stop layer are formed over the interconnect wire to prevent removal of a first interconnect dielectric layer surrounding the interconnect wire when forming the interconnect via to increase the processing window for the interconnect via.

Accordingly, in some embodiments, the present disclosure relates to an integrated chip comprising: a first interconnect dielectric layer arranged over a substrate; an interconnect wire extending through the first interconnect dielectric layer; a barrier structure arranged directly over the interconnect wire; an etch stop layer arranged over the barrier structure and surrounding outer sidewalls of the barrier structure; a second interconnect dielectric layer arranged over the etch stop layer; and an interconnect via extending through the second interconnect dielectric layer, the etch stop layer, and the barrier structure to contact the interconnect wire.

In other embodiments, the present disclosure relates to an integrated chip comprising: a first interconnect dielectric layer arranged over a substrate; an interconnect wire extending through the first interconnect dielectric layer; a barrier structure arranged directly over the interconnect wire; an etch stop layer arranged over the barrier structure and surrounding outer sidewalls of the barrier structure; a second interconnect dielectric layer arranged over the etch stop layer; and an interconnect via extending through the second interconnect dielectric layer and the etch stop layer to contact the interconnect wire and the barrier structure.

In yet other embodiments, the present disclosure relates to a method comprising: forming a first interconnect dielectric layer over a substrate; forming an interconnect wire within and extending through the first interconnect dielectric layer; forming a barrier structure directly on the interconnect wire; forming an etch stop layer over the first interconnect dielectric layer and the barrier structure; forming a second interconnect dielectric layer over the etch stop layer; performing a first removal process to form a cavity extending through the second interconnect dielectric layer to expose an upper surface of the etch stop layer; performing a second removal process to extend the cavity through an upper portion of the etch stop layer to expose an upper surface of the barrier structure; and forming a conductive material within the cavity to form an interconnect via coupled to the interconnect wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a first interconnect dielectric layer arranged over a substrate;
an interconnect wire extending through the first interconnect dielectric layer;
a barrier structure arranged directly over the interconnect wire;
an etch stop layer arranged over the barrier structure and surrounding outer sidewalls of the barrier structure;
a second interconnect dielectric layer arranged over the etch stop layer; and
an interconnect via extending through the second interconnect dielectric layer, the etch stop layer, and the barrier structure to contact the interconnect wire;
wherein the interconnect via comprises a middle surface that is arranged between a topmost surface and a bottommost surface of the interconnect via, and wherein the middle surface of the interconnect via is arranged below a topmost surface of the barrier structure.

2. The integrated chip of claim 1, wherein the bottommost surface of the interconnect via directly contacts an upper surface of the interconnect wire, and wherein an entirety of the bottommost surface of the interconnect via directly overlies the upper surface of the interconnect wire.

3. The integrated chip of claim 1, wherein the bottommost surface of the interconnect via has a width that is less than or equal to a width of an upper surface of the interconnect wire.

4. The integrated chip of claim 1, wherein the barrier structure comprises a metal, and wherein the barrier structure comprises a different material than the interconnect wire and the etch stop layer.

5. The integrated chip of claim 1, wherein the barrier structure comprises a dielectric material, and wherein the barrier structure comprises a different material than the etch stop layer.

6. The integrated chip of claim 1, wherein the etch stop layer comprises a different material than the first and second interconnect dielectric layers.

7. The integrated chip of claim 1, further comprising:
an additional interconnect wire arranged laterally beside the interconnect wire and spaced apart from the interconnect wire by the first interconnect dielectric layer; and
an additional barrier structure arranged directly over the additional interconnect wire and spaced apart from the barrier structure by the first interconnect dielectric layer.

8. The integrated chip of claim 7, wherein the interconnect via is not arranged directly between the interconnect wire and the additional interconnect wire.

9. An integrated chip comprising:
a first interconnect dielectric layer arranged over a substrate;
an interconnect wire extending through the first interconnect dielectric layer;
a barrier structure arranged directly over the interconnect wire;

an etch stop layer arranged over the barrier structure and surrounding outer sidewalls of the barrier structure;

a second interconnect dielectric layer arranged over the etch stop layer; and an interconnect via extending through the second interconnect dielectric layer and the etch stop layer to contact the interconnect wire and the barrier structure;

wherein the barrier structure comprises a dielectric material that is a different material than the first interconnect dielectric layer and that comprises a metal oxide.

10. The integrated chip of claim 9, wherein the interconnect via extends completely through the barrier structure to directly contact the interconnect wire.

11. The integrated chip of claim 9, wherein the interconnect via comprises a middle surface that is arranged between a topmost surface and a bottommost surface of the interconnect via, and wherein the middle surface of the interconnect via is arranged below a topmost surface of the barrier structure.

12. The integrated chip of claim 9, wherein the interconnect via is arranged completely above the interconnect wire.

13. The integrated chip of claim 9, wherein the barrier structure and the etch stop layer form a common sidewall facing and directly contacting the interconnect via.

14. The integrated chip of claim 9, wherein the interconnect via wraps around a corner of the etch stop layer, and wherein the corner is recessed relative to a topmost surface of the etch stop layer.

15. The integrated chip of claim 9, wherein a profile of the interconnect via is asymmetric about a vertical axis at a width-wise center of the interconnect via.

16. A method comprising:

forming a first interconnect dielectric layer over a substrate;

forming an interconnect wire within and extending through the first interconnect dielectric layer;

forming a barrier structure directly on the interconnect wire;

forming an etch stop layer over the first interconnect dielectric layer and the barrier structure;

forming a second interconnect dielectric layer over the etch stop layer;

performing a first removal process to form a cavity extending through the second interconnect dielectric layer to expose an upper surface of the etch stop layer;

performing a second removal process to extend the cavity through an upper portion of the etch stop layer to expose an upper surface of the barrier structure; and forming a conductive material within the cavity to form an interconnect via coupled to the interconnect wire;

wherein after the second removal process, a middle surface of the etch stop layer is formed, wherein the middle surface is between a topmost surface and a bottommost surface of the etch stop layer.

17. The method of claim 16, wherein the second removal process comprises a second etchant, wherein the barrier structure is substantially resistant to removal by the second etchant.

18. The method of claim 16, further comprising:

performing a third removal process to extend the cavity through the barrier structure to expose an upper surface of the interconnect wire, wherein the third removal process is performed after the second removal process and before the forming of the conductive material.

19. The method of claim 18, wherein the etch stop layer is substantially resistant to removal by the third removal process.

20. The method of claim 18, wherein the etch stop layer has a stepped profile in the cavity upon completion of the third removal process.

* * * * *